US010942042B2

(12) United States Patent
Bidaux et al.

(10) Patent No.: US 10,942,042 B2
(45) Date of Patent: Mar. 9, 2021

(54) SENSOR SYSTEM COMPRISING OFFAXIS INSENSITIVE MULTIPOLE MAGNET

(71) Applicant: Melexis Technologies SA, Bevaix (CH)

(72) Inventors: Yves Bidaux, Yverdon-les-Bains (CH); Jean-Claude Depoorter, Paal (BE); Jan-Willem Burssens, Tielt-Winge (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 103 days.

(21) Appl. No.: 16/249,139

(22) Filed: Jan. 16, 2019

(65) Prior Publication Data
US 2019/0293454 A1  Sep. 26, 2019

(30) Foreign Application Priority Data

Mar. 24, 2018 (EP) ..................................... 18163815
Dec. 5, 2018 (EP) ..................................... 18210600

(51) Int. Cl.
*G01D 5/14* (2006.01)
*G01R 33/07* (2006.01)
(Continued)

(52) U.S. Cl.
CPC .......... *G01D 5/145* (2013.01); *G01D 5/24438* (2013.01); *G01R 33/0206* (2013.01); *G01R 33/077* (2013.01)

(58) Field of Classification Search
CPC ...... G01D 5/14; G01D 5/145; G01D 5/24438; G01D 5/2448; G01B 7/023; G01B 7/14;
(Continued)

(56) References Cited

U.S. PATENT DOCUMENTS

2002/0021124 A1   2/2002   Schott et al.
2003/0011455 A1   1/2003   Wakuda et al.
(Continued)

FOREIGN PATENT DOCUMENTS

GB    2313444 A    11/1997
JP    2004056936 A  2/2004
(Continued)

OTHER PUBLICATIONS

Extended European Search Report from EP Application No. 18163815.6, dated Nov. 9, 2018.

*Primary Examiner* — Jermele M Hollington
*Assistant Examiner* — Suresh K Rajaputra
(74) *Attorney, Agent, or Firm* — Workman Nydegger

(57) ABSTRACT

A sensor system comprises a magnetic field generator and a sensor device arranged at a distance from said magnetic field generator and adapted for measuring or determining at least one magnetic field component and/or at least one magnetic field gradient component. The magnetic field generator comprises a multi-pole magnet having a number N of pole pairs that are axially magnetized to generate an N-pole magnetic field that is substantially rotationally symmetric around an axis. The magnet comprises a plurality of grooves and/or elongate protrusions that are arranged in a rotationally symmetric pattern around the axis to provide a substantially constant magnetic field gradient in a central region around said axis.

19 Claims, 10 Drawing Sheets

(51) Int. Cl.
*G01R 33/02* (2006.01)
*G01D 5/244* (2006.01)

(58) Field of Classification Search
CPC .. G01B 7/003; G01R 33/077; G01R 33/0206; G01R 33/07; G01R 33/02; H01F 7/00
See application file for complete search history.

(56) References Cited

U.S. PATENT DOCUMENTS

2010/0134095 A1   6/2010  Loreit et al.
2015/0226581 A1*  8/2015  Schott .................... G01D 5/145
                                                                  324/207.2

FOREIGN PATENT DOCUMENTS

WO         9854547 A1   12/1998
WO     2014029885 A1    2/2014

* cited by examiner

FIG. 10(a)

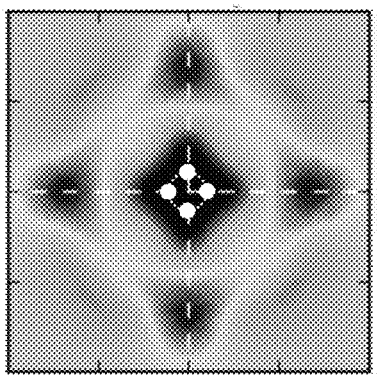

For classical ring magnet without groove:
If sensor is located perfectly in the middle, and infinately small,
then calculated signal (using arctan) is a perfect sine wave as function of θ

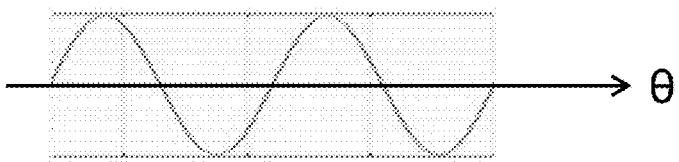

FIG. 10(b)

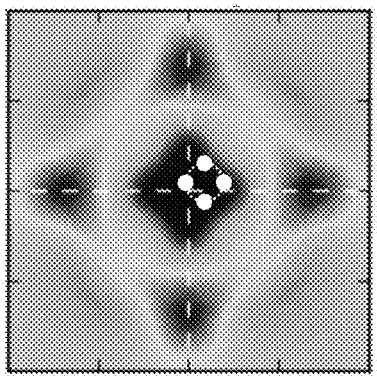

For classical ring magnet without groove:
Magnetic field has non-uniform gradients,
In case of position-offset,
calculated signal looks sinusoidal,
+ error signal=∑(higher harmonics).

Error signal is dependent on θ,dX,dY,
hence sensitive to offset-drift

FIG. 10(c)

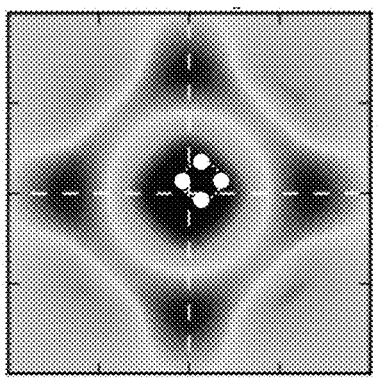

For ring magnet with grooves:
Magnetic field has more uniform gradients,
In case of position-offset,
calculated signal looks sinusoidal,
+ error signal=∑(higher harmonics),
but higher harmonics are reduced.

Error signal is dependent on θ,
but not significantly on dX,dY,
hence highly insensitive to offset-drift

SENSOR SYSTEM COMPRISING OFFAXIS INSENSITIVE MULTIPOLE MAGNET

FIELD OF THE INVENTION

The present invention relates to a sensor system using a multipole magnet.

BACKGROUND OF THE INVENTION

Sensor systems, in particular linear or angular position sensor systems are known in the art. In such systems typically a non-uniform magnetic field is generated (e.g. by means of a static electrical current, or by means of a permanent magnet) and is measured by a sensor device comprising one or more sensor elements and a readout circuit and a processor which calculates a linear or angular position based on the measured values.

Various sensor arrangements and various techniques for determining an angular position are known in the art, each having its advantages and disadvantages, for example in terms of cost, compactness, angular range, accuracy, signal sensitivity, robustness against unwanted external fields, robustness against position errors (e.g. axial or radial offset), processing power, processing complexity, etc.

For example, US2002021124A1 describes a sensor for the detection of the direction of a magnetic field, using a magnetic field concentrator and horizontal Hall-effect elements.

WO9854547A1 describes a magnetic rotation sensor with four sensor elements, arranged near a two-pole magnet. An angular position is calculated as an arctan function of a ratio of difference signals. This arrangement is said to be robust against offset and sensitivity variations, and against a constant external magnetic field.

WO2014029885A1 describes a sensor arrangement for measuring an absolute angular position using a multi-pole magnet. Some embodiments described herein are highly robust against position errors, and/or robust against a constant external magnetic field, and/or robust against a constant external field gradient, for example by using a more complex algorithm, and/or by using a more complex magnet and/or a higher number of sensor elements.

There is always room for improvements or alternatives.

SUMMARY OF THE INVENTION

It is an object of embodiments of the present invention to provide a sensor system (e.g. an angular position sensor system) which is highly robust or more robust against position errors and/or against position error drift over time.

It is also an object of embodiments of the present invention to provide a sensor system which is more accurate during the lifetime of the sensor system, despite mechanical drift (position error variations), and/or in the presence of vibrations.

It is an object of particular embodiments of the present invention to provide an angular position sensor system comprising a multi-pole ring magnet and a sensor device, wherein a position error of the sensor device and the ring magnet (e.g. axial shift and/or radial offset) due to mechanical drift and/or mechanical wear and/or mechanical vibrations, is reduced.

These objectives are accomplished by a sensor system and a multi-pole ring magnet according to embodiments of the present invention.

According to a first aspect, the present invention provides a sensor system comprising a magnetic field generator and a sensor device arranged at a distance from the magnetic field generator. The sensor device is adapted for measuring or determining at least one magnetic field component and/or at least one magnetic field (spatial) gradient component. The magnetic field generator comprises a multi-pole magnet, e.g. a multi-pole ring magnet, having a number N (e.g. N being at least 4) of pole pairs that are axially magnetized to generate an N-pole magnetic field that is substantially rotationally symmetric around an axis. The magnet comprising a plurality of grooves and/or protrusions, e.g. elongate protrusions, or combinations of grooves and protrusions. The grooves and/or protrusions are arranged in a rotationally symmetric pattern around said axis, and are shaped and sized (e.g. have a cross section with a cut-out) so as to provide a substantially constant magnetic field gradient in a central region around said axis. The number of grooves and/or protrusions may be equal to the number N.

Thus, the magnetic field generator may be configured to generate a multipole magnetic field comprising a plurality of poles. The multipole magnetic field may be substantially rotation symmetric around the axis. The plurality of grooves and/or elongate protrusions may form a mechanical or magnetic periodic feature having a shape that is rotation symmetric around the axis. This mechanical or magnetic periodic feature may have dimensions so as to reduce spatial inhomogeneities or spatial non-idealities of at least one magnetic quantity or at least one derived quantity of said multipole magnetic field. With "spatial inhomogeneities" is meant "inhomogeneities at different locations in space", thus as a function of X,Y,Z.

In other words, field gradients of this magnetic field generator with the periodic feature are more uniform or more constant than field gradients of the same magnetic field generator not having the periodic feature, at least in a relatively small cylindrical space around said axis.

It is an advantage of this magnetic field generator that a more homogeneous or a more ideal signal is generated, allowing the sensor system to be more robust against position errors of the sensor device with respect to the magnetic field generator. As a consequence, such sensor system is more robust against ageing effects, such as mechanical wear.

It is an advantage of embodiments that inhomogeneities or non-idealities can be reduced or compensated in a passive manner, i.e. without requiring energy or without requiring processing power.

In preferred embodiments, "reducing spatial inhomogeneities or non-idealities" means that field gradients in a particular direction, measured inside a circular area located in a plane perpendicular to the axis are "substantially constant".

The at least one magnetic field gradient may, for example, comprise at least four spatial field gradients dBx/dx, dBx/dy, dBy/dx and dBy/dy.

In an embodiment, said mechanical or magnetic periodic feature is rotation symmetric around said axis with a periodicity which is the same periodicity as the magnetic field.

In an embodiment, said mechanical or magnetic periodic feature is rotation symmetric around said axis with a periodicity of 720° divided by the number of poles.

For example, a so called "four-pole ring magnet", having a surface with four magnetic poles (two "North poles" and two "South poles") has a rotational symmetry of 720°/4=180°, because the magnetic field (as can seen by a sensor device located near the axis) will look the same if the ring magnet is rotated over 180° about its axis.

In an embodiment, the dimensions of said shape of said mechanical or magnetic feature are determined based on the following formula over an angular range of 360° around said axis. A maximum signal error can be defined in a volume of interest, e.g. at a distance from said magnetic field generator within a predefined distance range, and at an offset from said axis smaller than a predefined radius. This maximum signal error can be expressed as $\delta\theta_{max}=\max |\theta-\theta_m|$, wherein $\delta\theta_{max}$ is the maximum deviation evaluated over the volume of interest, and $\theta$ is an angular position about said axis being evaluated within the volume of interest. $\theta_m$ can be calculated by the following formula:

$$\theta_m = \arctan2\left(\frac{\delta B_x}{\delta y} + \frac{\delta B_y}{\delta x} + \frac{\delta B_x}{\delta x} + \frac{\delta B_y}{\delta y}\right) / 2$$

The magnetic field can be simulated for a plurality of positions within the volume of interest (e.g. on a predefined grid), e.g. using finite element simulation methods. As stated hereinabove, the volume of interest preferably covers substantially a full angular rotation around the axis (i.e. substantially 360°).

In some embodiments, the dimensions are determined by minimizing said maximum deviation. Alternatively, the dimensions can be determined by choosing dimensions for which said maximum deviation is smaller than a predefined threshold.

For example, parameters of the groove or elongated protrusion, e.g. a width, height and/or length can be optimized. For example, for a plurality of (combinations of) values for the parameter(s), the magnetic field may be simulated and evaluated over the volume of interest to determine the deviation $|\theta-\theta_m|$. Then, the parameter or combination of parameters may be selected that yields the minimum value, or a sufficiently small value, for the maximum deviation over the volume of interest.

In an embodiment, each of said plurality of grooves and/or elongate protrusions may be located at or near a transition between adjacent poles of the multi-pole magnet.

In an embodiment, the multi-pole magnet may consist of a single magnetisation material.

In an embodiment, the multi-pole magnet may consist of at least four sectors or regions, each comprising a single magnetisation material.

In an embodiment, the multi-pole magnet may be or comprise a permanent magnet.

In an embodiment, the multi-pole magnet may comprise exactly four or at least four or exactly six or at least six permanent magnets, located at a predefined distance from said axis.

It is an advantage of using a permanent magnet, because it allows to create a magnetic field in a passive manner, i.e. without consuming power.

In an embodiment, the permanent magnet is made of a single monolithic piece of material.

In an embodiment, the multipole magnetic field generator is a magnet, e.g. a ring magnet or a disk magnet, with a number of at least four pole pairs which are axially magnetized; and the mechanical or magnetic periodic feature comprises a same number (N) of grooves or structures having a predefined shape and dimensions.

In an embodiment, said grooves and/or protrusions may be radially oriented and/or axially oriented.

In an embodiment, said grooves and/or protrusions have a constant cross section.

It is an advantage that such a groove can easily and rapidly be created for example by milling.

In an embodiment, the cross section has a single rectangular shaped cut-out.

In an embodiment, the cross section has a single square-shaped cut-out.

In an embodiment, the cross section has a star shapes or asteroid shaped cut-out.

In an embodiment, the cross section has at least two or at least three rectangular shaped cut-outs.

In an embodiment, the cross section has at least two or at least three square shaped cut-outs.

In an embodiment, the cross section has a trapezoidal shaped cut-out.

In an embodiment, the cross section has a substantially elliptical shaped cut-out.

In an embodiment, the cross section has a polygonal shaped cut-out.

In an embodiment, said grooves or protrusions are located only at one planar surface of the magnet, at transitions between adjacent poles.

In an embodiment said grooves or protrusions are located on both planar surfaces of the magnet, at transitions between adjacent poles.

It is an advantage of providing such a groove or protrusion on both surfaces of the magnet, that it reduces the risk that the magnet is incorrectly mounted (flipped) during assembly of the sensor system. The groove or protrusion on the opposite side of the magnet has no significant impact on the magnetic field measured by the sensor device.

In an embodiment, the sensor device may be a linear position sensor system, or an angular position sensor system.

Preferably the sensor device is an integrated chip (IC) containing a semiconductor device, e.g. a CMOS device.

In an embodiment, the sensor device comprises at least three magnetic sensor elements located in a plane parallel to a planar surface of magnetic field generator, the at least three magnetic sensor elements not being collinear.

It is an advantage of such sensor device that it can measure or determine in-plane field gradients, for example dBx/dx, dBx/dy, dBy/dx, dBy/dy.

In an embodiment, the sensor system is a position sensor system; and the sensor device is movably arranged at a distance from said multipole magnetic field generator.

The magnetic field gradient components may vary as a function of a position of the sensor device relative to the multipole magnetic field generator as a substantially sinusoidal signal having a ground frequency and higher harmonics; and the grooves and/or protrusions may be adapted for reducing the higher harmonics.

More specifically, if the periodic function is described as a Fourier series with a main component and a plurality of higher order components (also known as "higher harmonics"). These harmonics cause inaccuracies of the position to be measured, which inaccuracies become more pronounced if the position of the sensor device relative to the magnetic generator deviates further from the envisioned position the sensor system was designed for. in embodiments of the present invention, the mechanical or magnetic period feature is chosen such that some or all coefficient of the higher harmonic components of said periodic function, are less than a predefined fraction of the amplitude of the main component, for example less than 5%, or less than 2%, or less than 1%, or less than 5000 ppm, or less than 2000 ppm.

It is an advantage that an optimal geometry of the periodic feature can be determined by computer simulations (in particular using Finite Element Modelling).

In an embodiment, the sensor device is adapted for measuring or determining one or more field gradients of said multipole magnetic field in a plane parallel to said multipole magnetic field generator.

In an embodiment, the sensor system is an angular position sensor system.

In this embodiment, the mechanical or magnetic periodic feature is preferably adapted for reducing spatial inhomogeneities or non-idealities of the measured in-plane magnetic field gradients dBx/dy and dBy/dx, measured in a plane at a distance from the magnetic field generator.

In an embodiment, a plane of the sensor device is arranged at an axial distance from the magnet, and a centre of the sensor device is located at a radial offset from a longitudinal axis of said ring magnet; and the plurality of grooves or structures are shaped and dimensioned such that an angular position error is less than 0.5° for any position of the centre of the sensor device within a virtual cylinder having a radius of 1.4 mm and located at an axial distance in the range from 1.5 mm to 4.5 mm.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(a) shows a top view of a four-pole ring magnet having a periodic feature in the form of radially oriented grooves located at a planar surface of the ring magnet.

FIG. 1(b) shows a side view of the four-pole ring magnet of FIG. 1(a), arranged relative to a sensor device located at an axial distance from the ring magnet, and at a radial offset from a central axis of the ring magnet.

FIGS. 10(a) to 10(c) summarize the principles of the present invention.

FIG. 10(a) shows an enlarged view of the plot dBx/dy of FIG. 5, and additionally shows a schematic representation of a sensor device having four sensor elements, located at zero radial offset with respect to the axis of the ring magnet.

FIG. 10(b) shows the plot dBx/dy of FIG. 10(a), and additionally shows the position of the sensor device with a non-zero radial offset.

FIG. 10(c) shows the plot dBx/dy of FIG. 7, and additionally shows a schematic representation of a sensor device having four sensor elements, at non-zero radial offset.

Figure 1A:
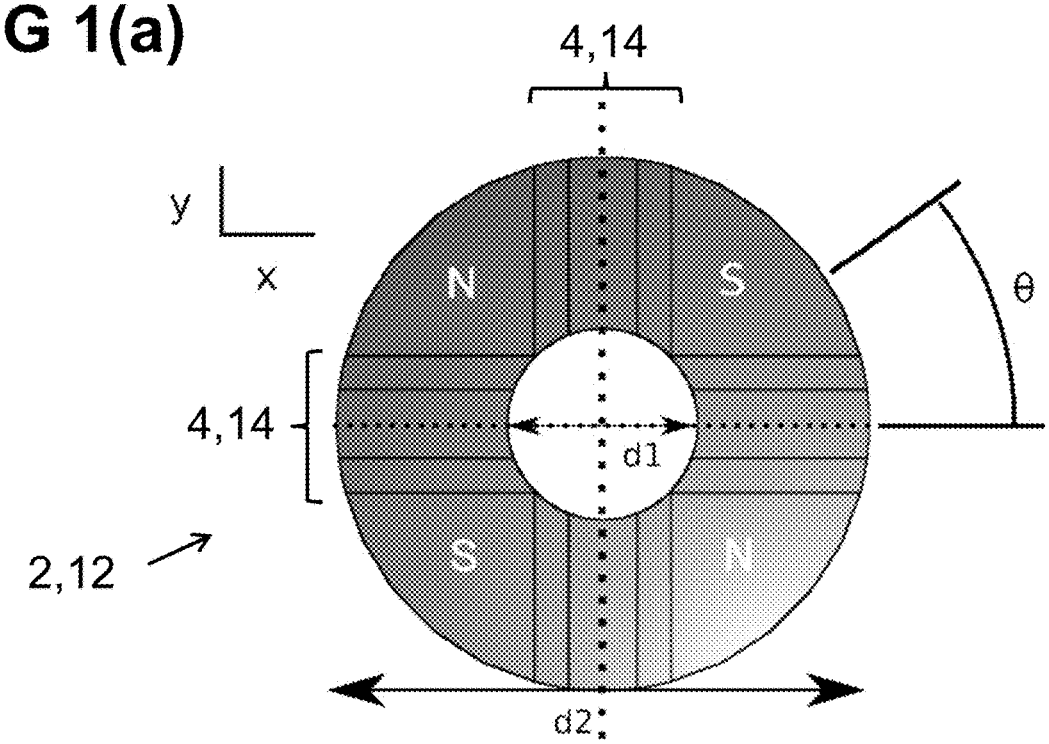
FIGS. 1(a) and 1(b) show a sensor system according to an embodiment of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document the terms "magnetic field generator" and "magnetic field source" mean the same.

The present invention relates to a sensor system comprising a magnetic field generator, e.g. an angular position sensor system. The multi-pole magnetic field generator is typically arranged at a distance from a sensor device.

The sensor system may be a linear or an angular position sensor system 11 comprising a multi-pole ring magnet 12, and comprising a sensor device 3, for example in the form of an integrated circuit 13 comprising at least three or at least four sensor elements for measuring one or more values of said magnetic field, and/or for measuring or calculations values derived therefrom (for example a field gradient can be measured by a differential circuit, or can be calculated by adding or subtracting several values). The sensor device typically also comprises a processor for calculating a linear or angular position based on those measured and/or calculated values.

As suggested in the background section, it is highly desirable to build a sensor system which is capable of measuring a value (e.g. a linear position or an angular position value) with high accuracy, in a manner which is highly robust against position offset (of the sensor device with respect to the magnetic field generator), and which is highly robust against sensitivity variations (e.g. absolute magnetic field strength), and which is highly robust against a constant external magnetic field (i.e. having a constant amplitude and orientation), and optionally also highly robust against a constant field gradient, or at least some of these characteristics. And it is highly desirable to provide a magnetic field generator (also referred to as "magnetic field source") providing a magnetic field which is better suited for achieving one or more of these goals.

As component sizes are continuously decreasing, it becomes increasingly more difficult to correctly position components (at least one of which is movable relative to the other) in an economical manner, especially in a production environment. It is a major challenge to conceive or develop sensor systems or sensor arrangements that are highly insensitive to position errors. Yet, such sensor systems would be easier to mount because tolerances can be relaxed.

It is even more challenging to create a sensor system which is robust against mechanical drift over the lifetime of the sensor system. While mounting errors due to misalignment of the sensor device and the magnetic source can be handled by means of a calibration test during production, where values (related to the particular offset) are measured and stored in the sensor device for later use, but this solution no longer works if the offset drifts over time, for example due to mechanical drift or wear. The known solutions using calibration can no longer be used, because the offset-position is unknown.

The inventors of the present invention were confronted with the problem of designing a sensor system (and parts thereof) which is more robust against position errors, without significantly decreasing the accuracy of the sensor system and/or without significantly decreasing the robustness against an (unwanted) constant external field and/or an (unwanted) external field gradient.

The inventors came to the idea of providing a sensor system 1 comprising a sensor device 3 and a multipole magnetic field generator 2 comprising a plurality of poles (or pole pairs). The sensor device 3 is arranged at a distance from said multipole magnetic field generator 2, and is adapted for measuring or determining at least one magnetic field component and/or at least one magnetic field gradient component, for example an in-plane magnetic field component Bx, By, or an out of plane field component Bz, or an in-plane field gradient dBx/dy, dBy/dx, dBx/dx, dBy/dy, dBz/dx, dBz/dy or an out of plane gradient dBz/dz, dBx/dz, dBy/d, or combinations hereof.

The multipole magnetic field generator 2 comprises a multi-pole magnet having a number N of pole pairs or poles that are axially magnetized to generate an N-pole magnetic field. The multipole magnetic field is substantially rotation symmetric around an axis 5. The magnetic field generator 2 further comprises a mechanical or magnetic periodic feature 4 having a shape which is also rotation symmetric around said axis 5, and having dimensions so as to reduce spatial inhomogeneities or spatial non-idealities of at least one magnetic quantity Bx, By, Bz or at least one derived quantity dBx/dx, dBx/dy, dBy/dx, dBy/dy, dBz/dx, dBz/dy, dBx/dz, dBy/dz, dBz/dz of said multipole magnetic field.

The magnet comprises a plurality of grooves 14 and/or elongate protrusions that are arranged in a rotationally symmetric pattern around the axis 5 such as to provide a substantially constant magnetic field gradient in a central region around the axis 5, e.g. a cylindrical region at a distance dz in the range from about 1.5 mm to about 4.5 mm from the magnetic field source, the cylindrical region having a radius less than 5 mm, or less than 4 mm, or less than 3 mm, or less than 2.0 mm, or less than 1.5 mm, or less than 1.0 mm.

With "reduce spatial inhomogeneities or non-idealities" is meant to make the quantity to be measured substantially or significantly constant in a limited space near the magnetic field source, more particularly within a cylindrical region at a distance dz in the range from about 1.5 mm to about 4.5 mm from the magnetic field source, the cylindrical region having a radius less than 5 mm, or less than 4 mm, or less than 3 mm, or less than 2.0 mm, or less than 1.5 mm, or less than 1.0 mm.

For example, in case of a linear or an angular position sensor, where the measured or derived signals may be substantially sinusoidal signals as a function of a linear or angular position θ, reducing inhomogeneities or non-idealities may mean reducing higher harmonics of said substantially sinusoidal signals.

When it is mentioned herein that the magnetic field generator has N poles, what is actually meant is that the sensor device can "see" or measure or experience N poles, but it may well be that the multi-pole magnetic field generator actually has N pole pairs, (thus 2×N poles), only half of which are "visible" to the sensor device. This is for example the case for the so-called "four-pole ring magnet" shown in FIG. 1(b), which actually has four axially magnetized pole pairs, but only half of the poles are visible to the sensor device. Such a ring magnet is commonly referred to as a "four pole ring magnet".

It is explicitly pointed out that the principles of the present invention will work with any existing sensor device 3 capable of measuring and/or processing magnetic field values originating from a multi-pole magnetic field source 2. As an example only, without limiting the present invention thereto, a sensor device 3 as can be used in embodiments of the present invention may comprise a plurality of horizontal Hall elements arranged for measuring a magnetic field component Bz oriented perpendicular to the substrate of the sensor device, or a plurality of vertical Hall elements arranged around a circle and oriented for measuring a radial field component Br, or a plurality of vertical Hall elements arranged around a circle and oriented for measuring a tangential field component Br, or a plurality of horizontal Hall elements with IMC for measuring a radial or tangential field component Br, Bt or another in-plane field component Bx, By, or other suitable sensor elements; and comprising a circuit or a processor for calculating a linear position or an angular position based on the measured values, for example using an arctan or arctan 2 function (also known as an inverse tangent function), or using a Fourier transformation, or using any other suitable mathematical function or algorithm.

In a preferred embodiment, the sensor system 1 is an angular position sensor system 11, and the sensor device 3 is an angular position sensor device 13 based primarily on the measurement of in-plane magnetic field gradients dBx/dy and dBy/dx, for example as described in WO2014029885A1, which document is incorporated herein by reference in its entirety, in particular those sections related to sensor devices capable of measuring an angular position relative to a four-pole ring magnet, but as already mentioned above, the present invention is not limited hereto.

Referring to the Figures.

Figure 1B:
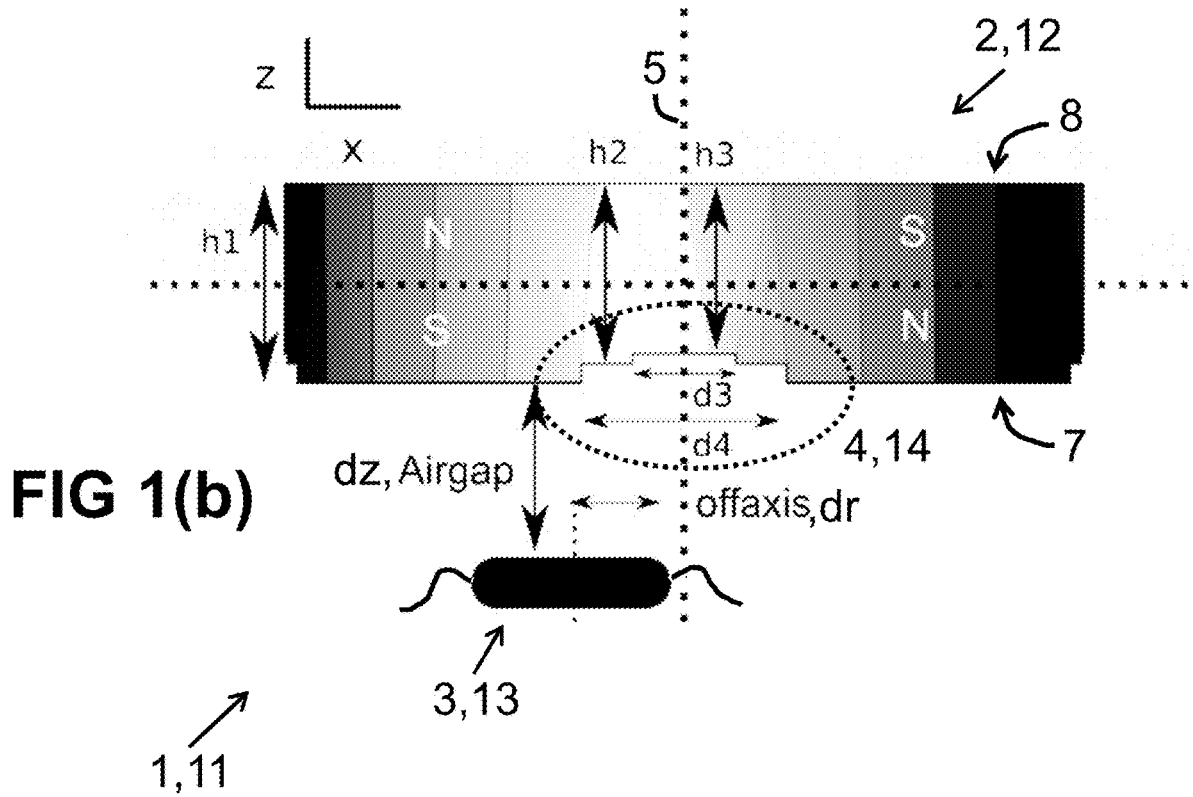

FIG. 1(a) shows a top view and FIG. 1(b) shows a side view of a four-pole ring magnet 12, which can be seen as an example of a multi-pole magnetic generator 2. The ring magnet 12 of FIG. 1(a) is a permanent magnet with four pole pairs which are axially magnetized.

Compared to classical ring magnets (see for example FIG. 4 of WO2014029885A1), the ring magnet shown in FIGS. 1(a) and 1(b) additionally have a periodic feature or a periodic structure 4, which in the example of FIGS. 1(a) and 1(b) have the form of radially oriented grooves 14 with a constant cross-section. But the invention is not limited to this particular feature, and other features may also be used, for example a groove profile or protrusion profile with a non-constant cross-section.

FIG. 1(b) shows a side view of the four-pole ring magnet of FIG. 1(a), and also shows a sensor device 3, in the example of FIG. 1(b) an integrated semiconductor device 13, located at a distance "dz" (also called "airgap") from a surface 7 of the ring magnet 12. The sensor device 13 (or actually a central point defined by the sensor elements within the sensor device) is positioned with a radial offset "dr" (also called "offaxis") from the central axis 5 of the ring magnet 12. Ideally, of course, the sensor device 13 is to be mounted at a predefined distance from the surface 7, for example dz=exactly 1.50 mm, and with zero radial offset with respect to the central axis 5, meaning dr=0.00 mm, but in practice the axial distance dz and the radial distance dr will slightly vary. As already mentioned above, a constant offset can easily be handled by a calibration test during production, but an offset drift over time, is currently not addressed.

It is known from WO2014029885A1 that the angular position can be derived from in-plane gradients dBy/dx and dBx/dy. These gradients can for example be calculated based on the signals obtained by at least three sensor elements which are not collinear, i.e. which are not located on a single straight line.

The inventors came to the idea of addressing the problem related to incorrect positioning (axial offset and/or radial offset with respect to the envisioned position) and addressing the problems of mechanical drift not in the sensor device 13, but in the multi-pole magnet generator. More specifically, for the example of a permanent magnet in the form of an N-pole ring magnet, the inventors came to the idea of adding a periodic feature to the ring magnet. In the example of FIGS. 1(a) and 1(b) the periodic feature is a groove having two rectangular cross sections, but other grooves can also be used.

Figure 2:
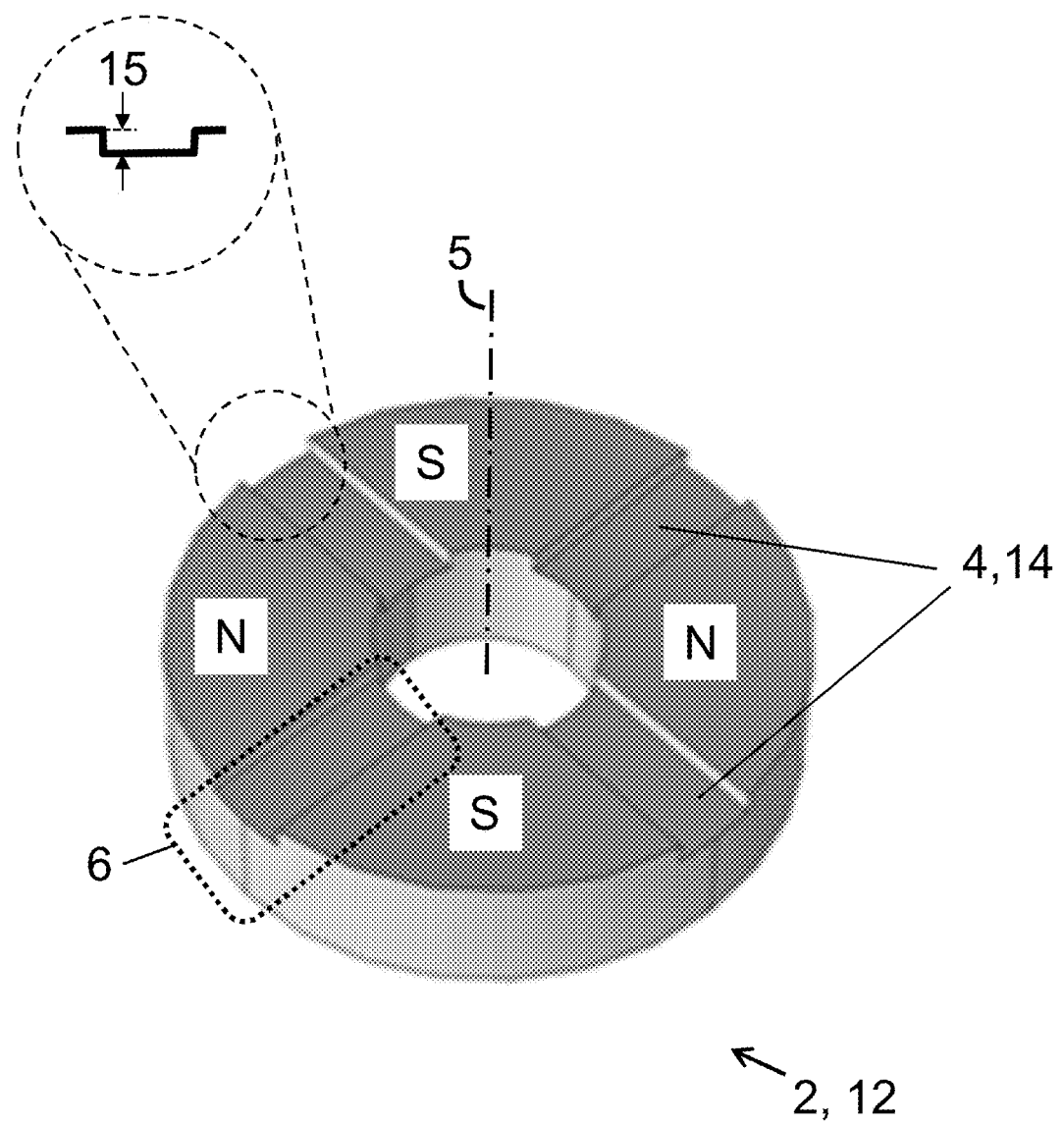
FIG. 2 shows a variant of the ring magnet of FIGS. 1(a) and 1(b) in perspective view, having a slightly different groove.

FIG. 2 shows a variant of the ring magnet of FIGS. 1(a) and 1(b) in perspective view, having a slightly different groove. The ring magnet of FIG. 2 has four grooves applied to a planar surface of the ring magnet, each groove being located at a transition between a north & south pole. In contrast to FIGS. 1(a) and 1(b) where each groove has two rectangular cut-outs, the groove of FIG. 2 has only a single rectangular cut-out.

Figure 11A:
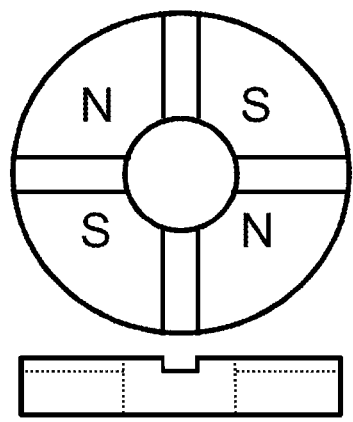
FIGS. 11(a) to 11(f) show several embodiments of a magnetic field generator according to the present invention.
Figure 11B:
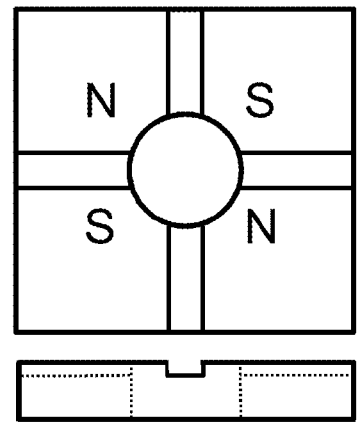
Figure 11C:
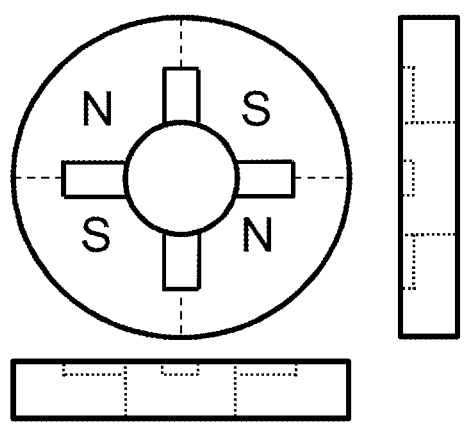
Figure 11D:
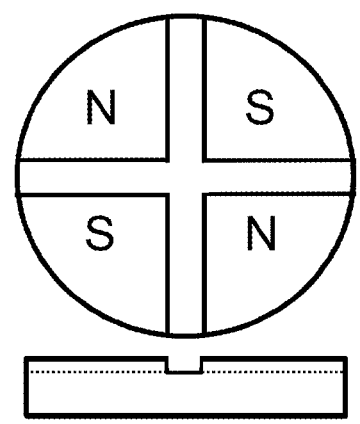
Figure 11E:
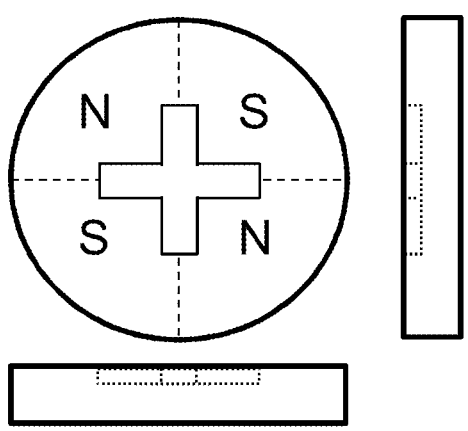
Figure 11F:
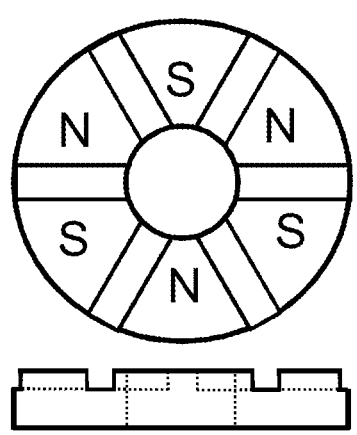

As can be appreciated from FIG. 1(a), the ring magnet 12 itself has a rotation symmetry of 180° (meaning that the magnetic field generated by the magnet looks the same when the ring magnet is rotated over 180° about the axes 5). It can be seen in FIG. 2 that the periodic feature or periodic structure has a rotational periodicity of 90°, or in other words, occurs every 90°. For a six-pole magnet, the periodic feature would be applied every 60°, as shown in FIG. 11(f), etc.

In preferred embodiments, the periodic feature 4 is a groove 14 applied to the surface 7 of the ring magnet 12 that will face the sensor device 13, but of course it is also possible to apply grooves on both sides 7, 8 of the ring magnet, to avoid misplacement of the ring magnet during production. However, it shall be appreciated that a similar effect can be achieved, in accordance with embodiments of the present invention, by other means of modulating a local thickness of the magnet, e.g. by elongate protrusions, for example by radially arranged elongated zones of geometric variation.

In preferred embodiments, the grooves have a constant cross section, which is easier to produce, but that is not absolutely required.

The grooves may extend from the inner diameter to the outer diameter, but that is not absolutely required, and for example a groove starting from the inner diameter and stopping for example about halfway between the inner diameter and the outer diameter (see FIG. 11c) will also work.

The grooves or protrusions may be applied at the transitions 6 between adjacent poles, as shown in FIG. 2. For example, grooves, e.g. radially aligned elongated grooves, may be applied at the transitions. Alternatively, elongated protrusions, e.g. radially aligned elongated protrusions, may be applied in between, e.g. centred between, the transitions.

In the specific example shown in FIG. 1(b), the cross section of the groove 14 has two rectangular cut-outs, which can for example be produced by milling a classical ring magnet, but the invention is not limited thereto, and cross sections with another shape can also be used, for example a cross section with a single rectangular cut-out, or a cross section with more than two rectangular cut-outs, a cross section with a single square cut-out, a cross section with at least two a square cut-outs, or a cross section with a trapezoidal cut-out, or a cross section with a substantially elliptical cut-out, or a cross section with a polygonal cut-out, etc. In the examples of FIG. 1(b) the grooves have a constant depth (h1−h2 is constant and h1−h3 is constant) as a function of the radius, and in FIG. 2 the grooves also have a constant depth 15, but also that is not absolutely required, and the depth of the grooves may vary with the radius, for example linearly or non-linearly, for example monotonically increasing or monotonically decreasing towards the axis.

It was surprisingly found that such grooves can significantly improve robustness against axial and/or radial displacement of the magnet 12 relative to the sensor device 13, or stated in other terms, can significantly reduce the impact of mechanical offset drift over the lifetime of the sensor system 11.

Figure 3:
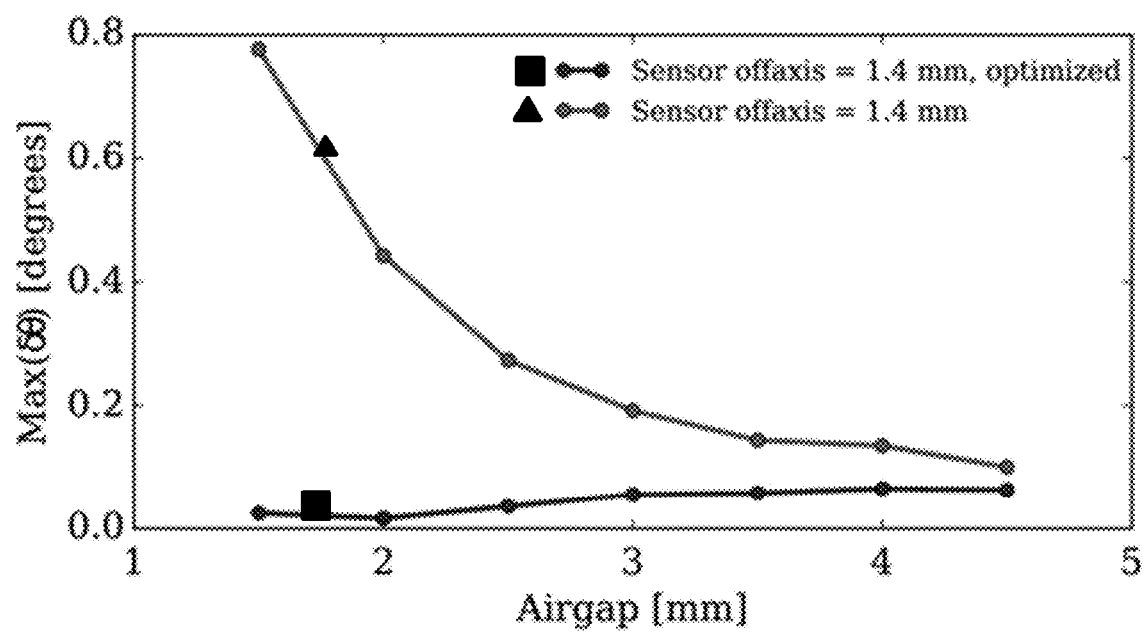
FIG. 3 shows the maximum position error (over the angular range) of the sensor system of FIG. 1(b) when using a classical ring magnet with an outer diameter of 14 mm (curve with triangle) versus using a ring magnet with an additional periodic feature as proposed by the present invention (curve with square) for a radial offset of 1.4 mm and various axial positions from 1.5 mm to 4.5 mm.

FIG. 3 shows the maximum position error (over the angular range) of the sensor system 1 of FIG. 1(b) using a classical ring magnet (without grooves), and the same ring magnet with grooves 14, assuming that the sensor device 13 is located at a radial offset of 1.4 mm, for various values of the axial distance (or airgap), ranging from 1.5 mm to 4.5 mm in steps of 0.5 mm.

As can be seen from the curve with the triangle, using a classical ring magnet without the grooves 14, the error is about 0.8° (if the sensor device 2 is located at 1.5 mm from the magnet), while the error is lower than 0.1° using the ring magnet 14 with the grooves, as can be appreciated from the curve with the square. It is noted that the error signal using the ring magnet with the grooves 14 is lower than for the classical ring magnet without the grooves, thus the ring magnet with the grooves is not even a trade-off, but a clear improvement.

The principles of the present invention will be explained by means of an example, but of course the present invention is not limited to this particular example, but can be applied more generally, as described by the claims.

In the example, the multipole magnetic field generator is a four-pole ring magnet, having the following dimensions: thickness h1 of 3.5 mm, inner diameter d1=5.0 mm, outer diameter d2=14.0 mm, as illustrated in FIGS. 1(a) and 1(b) and FIG. 2.

Four grooves 14 are applied to the ring magnet 12, at each crossing between a north pole and a south pole. The grooves are oriented radially, and have a cross section with two rectangular cut-outs. The dimensions of these cut-outs are optimized using a Finite Element Model, as follows.

The optimal dimensions for the grooves 14 were found by determining values d3, d4, h2, h4 for which a position error signal $\delta\theta$ defined as the maximum deviation (in absolute value) between the actual angle $\theta$ and the angular position $\theta_m$ as can be determined (measured and/or calculated) by the angular position sensor 13, based on in-plane field gradients, is minimized.

More specifically, for a given magnetic field, the relative angular position $\theta_m$ of the ring magnet 12 with respect to the sensor device 13 (or vice versa) can be calculated using the following formula, or an equivalent formula:

$$\theta_m = \arctan 2\left(\frac{\frac{\delta B_x}{\delta y} + \frac{\delta B_y}{\delta x}}{\frac{\delta B_x}{\delta x} - \frac{\delta B_y}{\delta y}}\right)\bigg/2 \quad (1)$$

and the maximum position error signal can be calculated using the following formula, or an equivalent formula:

$$\delta\theta_{max} = \max|\theta - \theta_m| \quad (2)$$

It is to be noted that the formulation of the arctan 2 hereinabove is to be considered as a short-hand for the more mathematically sound and consistent expression $$\arctan 2\left(\frac{Y}{X}\right) \stackrel{def}{=} \arctan 2(Y, X).$$

This function, as is well-known in the art, can be defined as the principal value of the argument function applied to the complex number X+iY, where i represents the imaginary unit, i.e. the square root of −1.

The optimal values for the groove 14 for this specific example were found to be: d3=3.6 mm, d4=1.8 mm, h2=3.17 mm, and h3=3.01 mm.

An explanation for this improvement will be given further, when discussing FIG. 5 to FIGS. 10(a) to 10(c).

Figure 4:
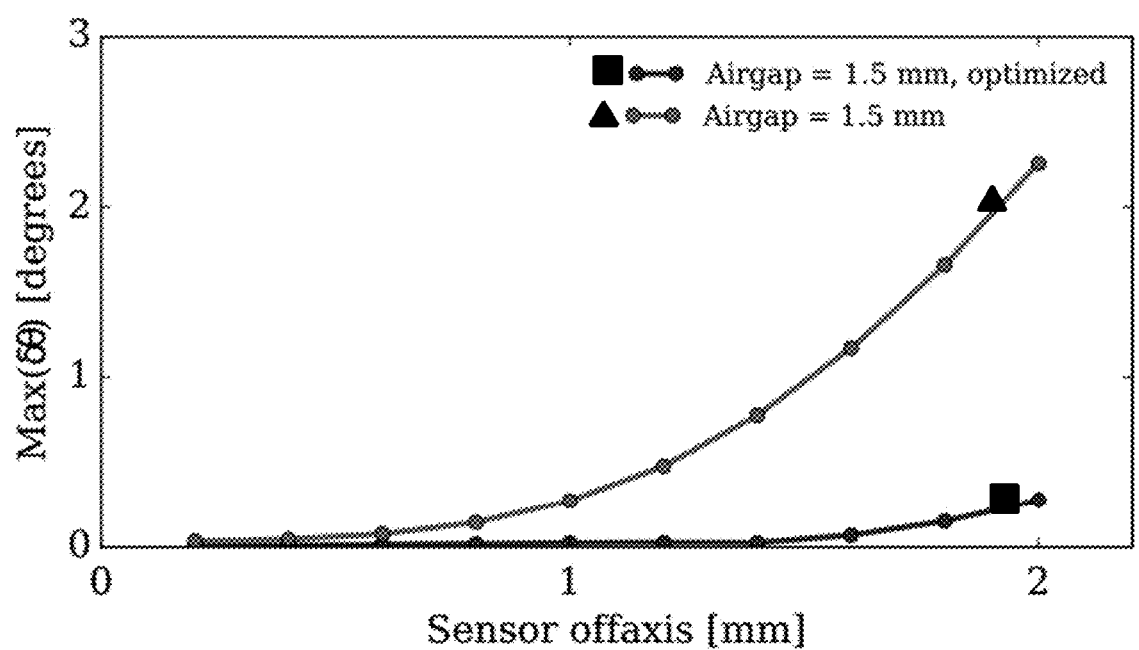
FIG. 4 shows the maximum position error (over the angular range) of the sensor system of FIG. 1(b) when using a classical ring magnet with an outer diameter of 14 mm (curve with triangle) versus using a ring magnet with an additional periodic feature as proposed by the present invention (curve with square) for an axial distance of 1.5 mm and various radial offsets from 0.0 to 2.0 mm.

FIG. 4 shows the maximum position error (over the angular range) of the sensor system 1 of FIG. 1(b) using a classical ring magnet (without grooves), and the same ring magnet but with the optimal grooves 14, assuming that the sensor device 13 is located at an axial distance (airgap) of 1.5 mm from the magnet 12, for various values of the radial offset (offaxis) ranging from 0.0 to 2.0 mm in steps of 0.2 mm.

As can be seen from the curve with the triangle, using a classical ring magnet without the grooves 14, the error is about 2° (if the sensor device is located at an offaxis of about 2 mm), while the error would be lower than 0.3° using the ring magnet with the optimal grooves 14, as can be appreciated from the curve with the square. It is noted again that the error signal using the ring magnet with the grooves 14 is lower than the classical ring magnet without the grooves.

Figure 5:
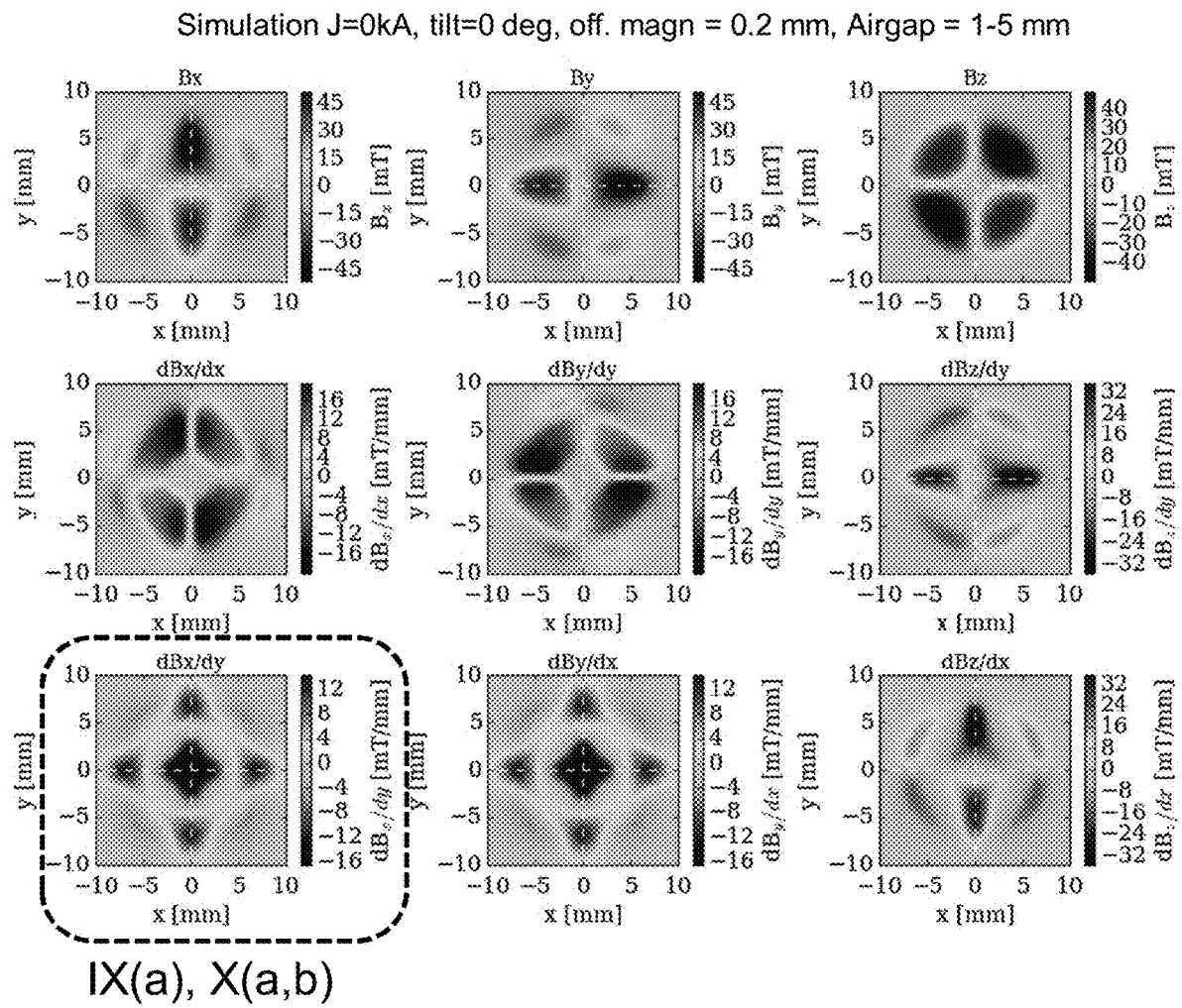
FIG. 5 shows simulated plots of magnetic field values Bx, By, Bz and of spatial field gradients dBx/dx, dBx/dy, dBy/dy, dBy/dx, dBz/dy, dBz/dx of a classical four-pole ring magnet (not having the grooves show in FIG. 2).
Figure 6:
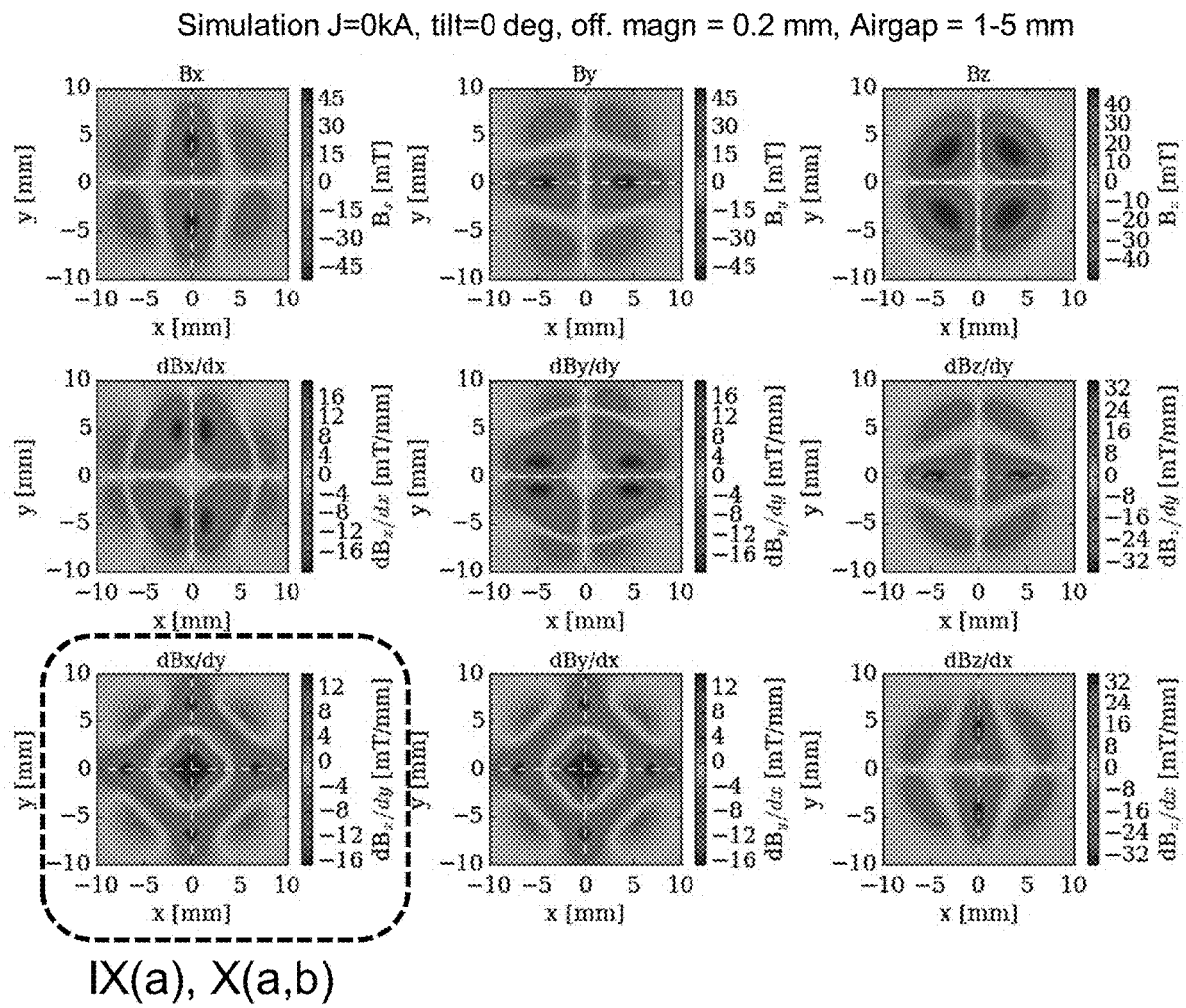
FIG. 6 is a grayscale version of the plots shown in FIG. 5.

FIG. 5 shows simulated amplitude plots of magnetic field values Bx, By, Bz and of spatial field gradients dBx/dx, dBx/dy, dBy/dy, dBy/dx, dBz/dy, dBz/dx of a classical four-pole ring magnet (not having the grooves show in FIG. 2). FIG. 6 shows the same plots in grayscale for illustrative purposes.

The angular position θ can be calculated mainly from the values of dBx/dy and dBy/dx in a small region around the center of the plots, because this is where the sensor elements of the sensor device are located, as illustrated in FIG. 10(*a*), where a sensor device with four sensor elements is shown for illustrative purposes.

As can be seen in the dBx/dy and dBy/dx plots of FIG. 5, the amplitude of the spatial gradient values measured inside the central region having a diamond shape are more or less constant or uniform. This is in agreement with FIG. 14 and FIG. 15 of WO2014029885A1, stating that the amplitude of the in-plane field component Br(r) and Bt(r) varies more or less linearly in the "linear region" as a function of the radius. The actual values of the measured gradients dBx/dy and dBy/dx vary like a sine and a cosine function of θ, hence by measuring these orthogonal gradients, the angular position can be determined using an arctangens function.

What WO2014029885A1 does not describe, however, is that, in case of an offset, the sinusoidal functions related to the spatial gradients are no longer purely sinusoidal with only a "ground frequency", but contain "higher harmonics". The inventors of the present invention came to the insight that the higher harmonics in the angular domain are caused by the non-uniformity or inhomogeneity of the spatial gradients within the diamond-shaped region. They further realized that, therefore, by making the field gradients more uniform in the vicinity of the axis, the harmonics will be automatically suppressed. And they furthermore succeeded in reducing these inhomogeneities by providing a plurality of grooves.

Figure 7:
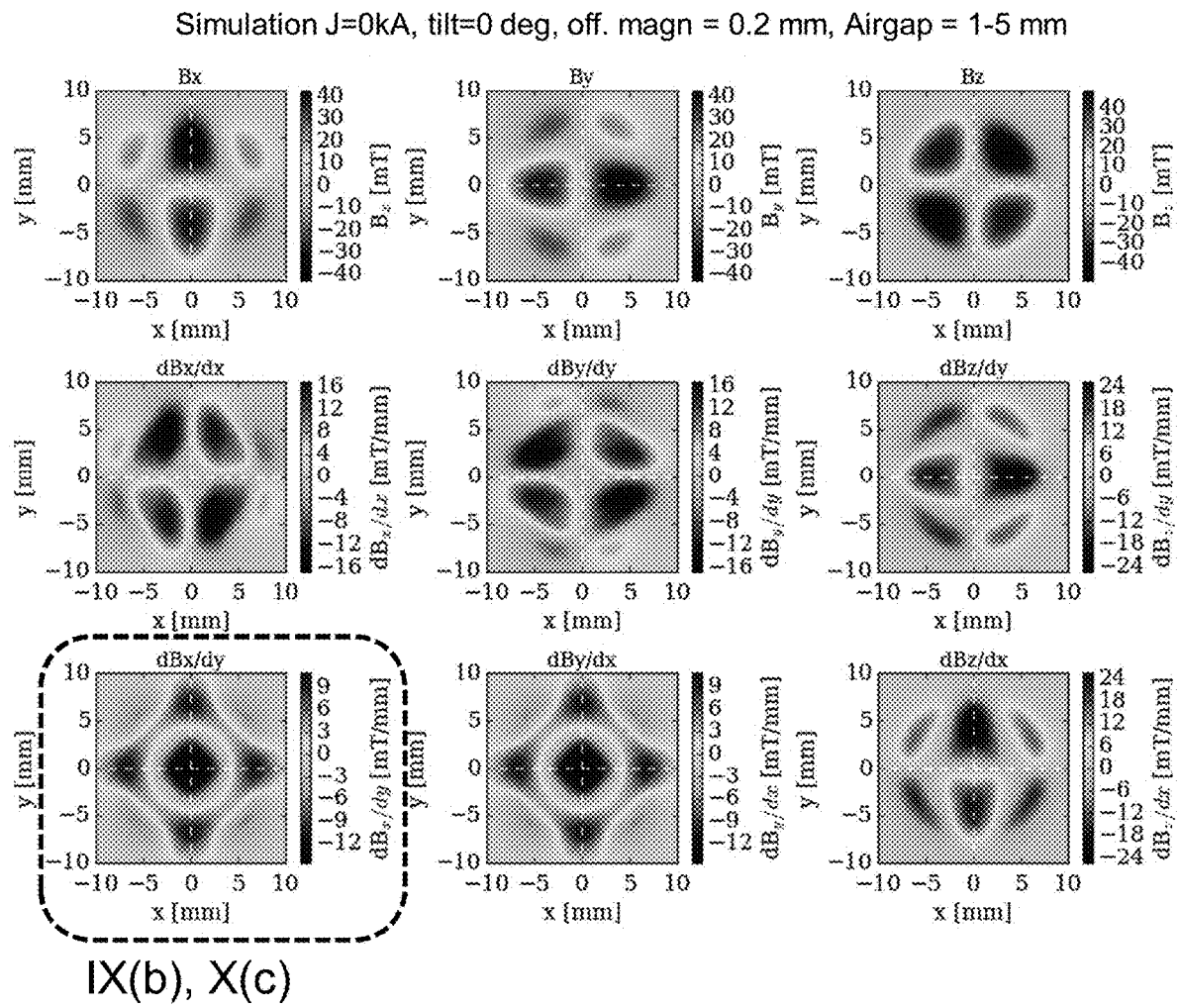
FIG. 7 shows simulated plots of magnetic field values Bx, By, Bz and of spatial field gradients dBx/dx, dBx/dy, dBy/dy, dBy/dx, dBz/dy, dBz/dx of the four-pole ring magnet of FIG. 2.

FIG. 7 shows simulated amplitude plots of magnetic field values Bx, By, Bz and of spatial field gradients dBx/dx, dBx/dy, dBy/dy, dBy/dx, dBz/dy, dBz/dx of the four-pole ring magnet of FIG. 2.

Figure 8:
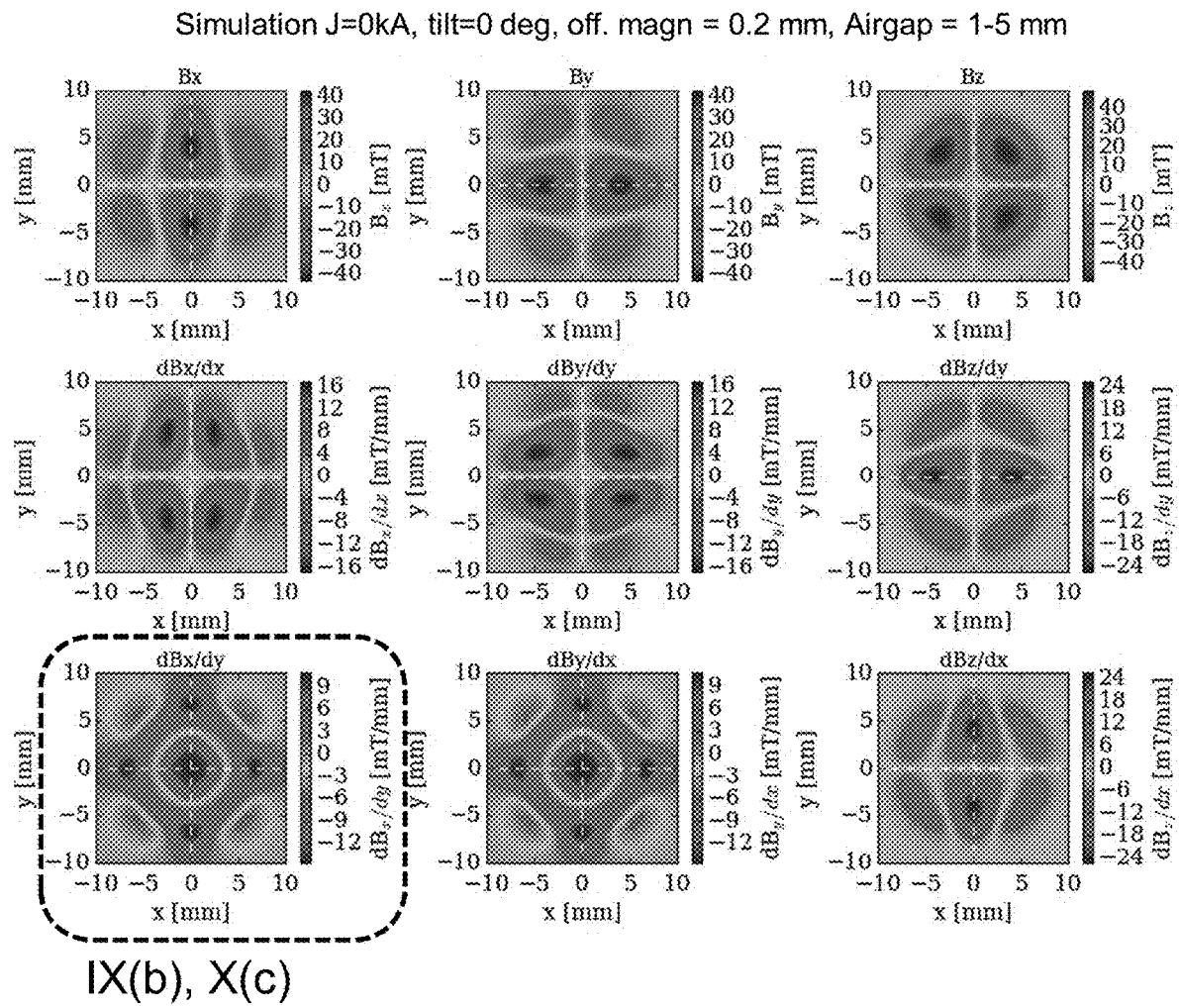
FIG. 8 is a grayscale version of the plots shown in FIG. 7.

FIG. 8 shows the same plots in grayscale for illustrative purposes.

Figure 9A:
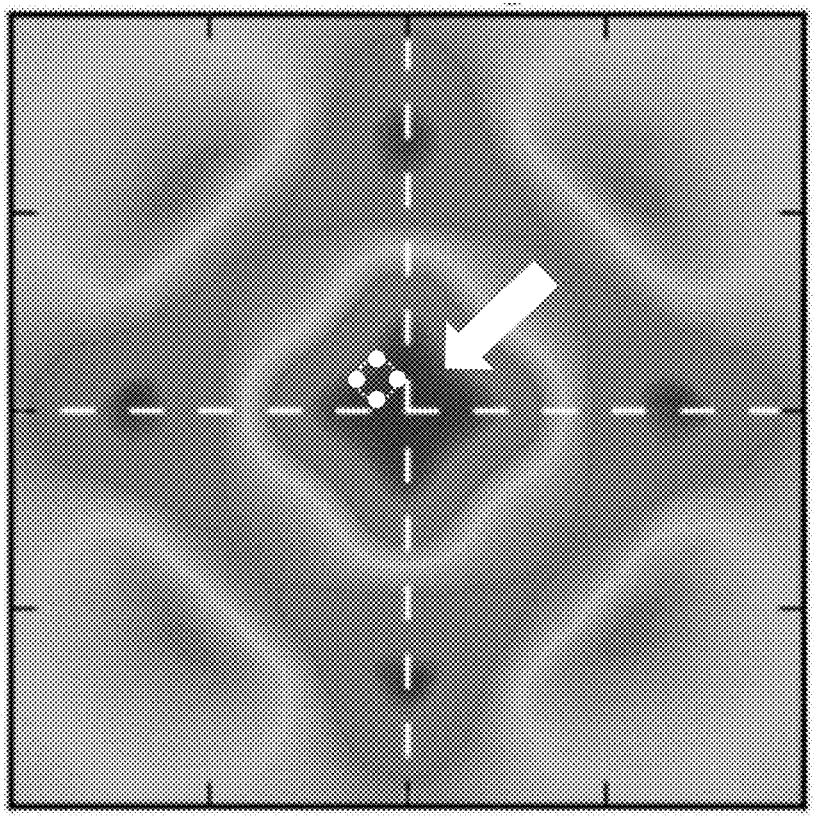
FIG. 9(a) is an enlarged view of the plot dBx/dy of FIG. 6, of the classical ring magnet.
Figure 9B:
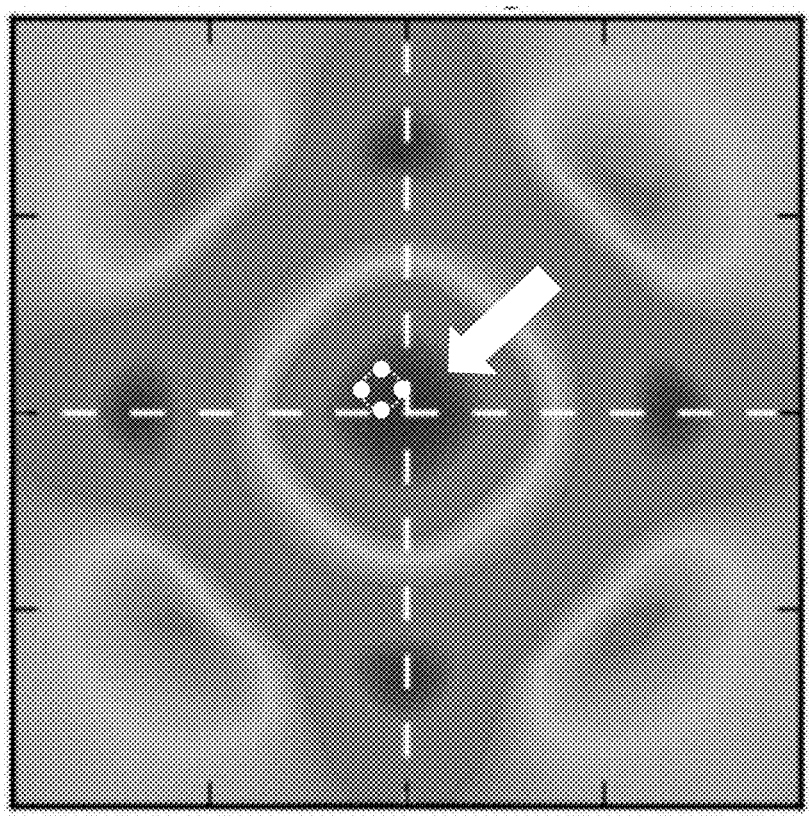
FIG. 9(b) is an enlarged view of the plot dBx/dy of FIG. 8 of the ring magnet of FIG. 2.

FIG. 9(*a*) is an enlarged view of the plot dBx/dy of FIG. 6, of the classical ring magnet.

FIG. 9(*b*) is an enlarged view of the plot dBx/dy of FIG. 8 of the ring magnet of FIG. 2.

It can be appreciated from these figures, especially from FIG. 9(*b*) that the field gradient dBx/dy of the ring magnet with grooves is much more uniform (in the substantially circular region around the axis, than the field gradient dBx/dy of the ring magnet without the grooves (shown in FIG. 9(*a*).

The result of the grooves being that the values of the field gradients measured anywhere within the substantially circular region (indicated by a white arrow) is substantially independent of the offset position, but only dependent on the angle θ between the sensor device and the ring magnet, in contrast to the case of FIG. 9(*a*), where the values of the field gradients measured not only depend on said angular position, but also (in a much larger degree) on the offset position.

FIGS. 10(*a*) to 10(*c*) summarize these principles again.

FIG. 10(*a*) shows the case of a classical ring magnet without a groove. If the sensor device is located perfectly in the middle, and is infinitely small (meaning that all sensor elements are located exactly at the same spot, which would be ideal but not possible in practice), the calculated signal would be a perfect sine wave as a function of the angle θ, without higher harmonics.

Referring to FIG. 10(*b*), if the magnetic field does not have uniform gradients, the measured value will differ (albeit slightly) from spot to spot. This translates to higher harmonics in the angular domain. If the offset position would be fixed, the error can be corrected for example by calibration and by using a look-up table (as is done in the prior art), but since the offset position is not known in case of mechanical drift, this technique does not work.

Referring to FIG. 10(*c*), if in contrast the magnetic field has a uniform gradient or a more uniform gradient, these higher harmonics are suppressed, and the gradient signals approach better a true sine and cosine signal without higher harmonics.

The invention is described by means of a ring magnet as an example, but the present invention is not limited thereto, and other magnets can also be used.

FIGS. 11(*a*) to 11(*f*) show several embodiments of a magnets with grooves having various shapes.

FIG. 11(*a*) is a four-pole ring magnet as described above in FIGS. 1(*a*) and 1(*b*) and FIG. 2. The magnet is a ring magnet with a cylindrical opening, and with four grooves extending from the inner radius to the outer radius.

In a variant (not shown), a bottom of the ring magnet is closed, hence, this magnet can be seen as a disk magnet with a cylindrical cavity in the center, and with four grooves extending in radial direction. The grooves may have a rectangular cross section, or another cross section (e.g. elliptical, trapezoidal, two rectangles, triangular, etc.)

FIG. 11(*b*) is a variant of the ring magnet of FIG. 11(*a*), having a square outer peripheral rather than a circular outer peripheral.

FIG. 11(*c*) is another variant of the ring magnet of FIG. 11(*c*) where the grooves do not extend from the inner radius to the outer radius, but stop about halfway. Other variants where the grooves extend over about 60% or about 70% or about 80% or about 90% of the radius, will of course also work.

FIG. 11(*d*) is another variant of the ring magnet of FIG. 11(*c*), not having a central opening. This embodiment can also be referred to as a disk magnet with grooves.

FIG. 11(*e*) is a variant of the disk magnet of FIG. 11(*d*) where the grooves do not extend over the entire diameter, but only over a fraction thereof.

FIG. 11(*f*) is a variant of the ring magnet of FIG. 11(*a*), having six pole pairs instead of four.

Other variants are also possible.

While individual features are explained in different drawings and different embodiments of the present invention, it is contemplated that features of different embodiments can be combined, as would be obvious to the skilled person, when reading this document.

The invention claimed is:

1. A sensor system comprising:
a magnetic field generator; and
a sensor device arranged at a distance from said magnetic field generator and adapted for measuring or determining at least one magnetic field component (Bx, By, Bz) and/or at least one magnetic field gradient component (dBx/dx, dBx/dy, dBy/dx, dBy/dy, dBz/dx, dBz/dy);
said magnetic field generator comprising a multi-pole magnet having a number of pole pairs that are axially magnetized to generate a magnetic field that is substantially rotationally symmetric around an axis, said magnet having a non-planar surface comprising a plurality of grooves and/or elongate protrusions that are arranged in a rotationally symmetric pattern around said axis and that are shaped and sized so as to provide a substantially constant magnetic field gradient in a central region around said axis.

2. The sensor system of claim 1, wherein the number of pole pairs is at least four.

3. The sensor system of claim 1, wherein said plurality of grooves and/or elongate protrusions consists of a number of grooves and/or elongate protrusions that is equal to the number of pole pairs of the multi-pole magnet.

4. The sensor system according to claim 1, wherein each of said plurality of grooves and/or elongate protrusions is located at or near a transition between adjacent poles of said multi-pole magnet.

5. The sensor system according to claim 1,
wherein said multi-pole magnet consists of a single magnetisation material;
or wherein said multi-pole magnet comprises at least four sectors or regions each consisting of a single magnetisation material.

6. A sensor system according to claim 1,
wherein said multi-pole magnet is or comprises a permanent magnet,
or wherein said multi-pole magnet comprises at least four permanent magnets located at a predefined distance from said axis.

7. A sensor system according to claim 1, wherein said grooves and/or elongate protrusions are radially oriented and/or axially oriented.

8. A sensor system according to claim 1, wherein said grooves and/or elongate protrusions have a constant cross section.

9. A sensor system according to claim 1, wherein said grooves and/or elongate protrusions have a cross section that has a single rectangular shaped or square shaped cut-out, or at least two or at least three rectangular shaped or square shaped cut-outs, or a star shaped or asteroid shaped cut-out, or a trapezoidal shaped cut-out, or a substantially elliptical shaped cut-out, or a polygonal shaped cut-out.

10. A sensor system according to claim 1, wherein said grooves and/or elongate protrusions are located only at one planar surface or on both planar surfaces of the multi-pole magnet.

11. A sensor system according to claim 1, wherein the sensor device comprises at least three magnetic sensor elements located in a plane parallel to a planar surface of the multi-pole magnet, the at least three magnetic sensor elements not being collinear.

12. A sensor system according to claim 1,
wherein the sensor system is a position sensor system; and
wherein the sensor device is movably arranged at a distance from said multipole magnetic field generator.

13. A sensor system according to claim 1, wherein the sensor device is adapted for measuring or determining one or more field gradient components (dBx/dx, dBx/dy, dBy/dx, dBy/dy, dBz/dx, dBz/dy) of said multipole magnetic field in a plane parallel to said multipole magnetic field generator.

14. A sensor system according to claim 1,
wherein a plane of the sensor device is arranged at an axial distance from the magnet; and
wherein a centre of the sensor device is located at a radial offset from a longitudinal axis of said magnet; and
wherein the plurality of grooves or structures are shaped and dimensioned such that an angular position error is less than 0.5° for any position of the centre of the sensor device within a virtual cylinder having a radius of 1.4 mm and located at an axial distance in the range from 1.5 mm to 4.5 mm.

15. The sensor system of claim 1, wherein said non-planar surface comprises the plurality of grooves and the elongate protrusions.

16. A sensor system comprising:
a magnetic field generator; and
a sensor device arranged at a distance from said magnetic field generator and adapted for measuring or determining at least one magnetic field component (Bx, By, Bz) and/or at least one magnetic field gradient component (dBx/dx, dBx/dy, dBy/dx, dBy/dy, dBz/dx, dBz/dy);
said magnetic field generator comprising a multi-pole magnet having a number of pole pairs that are axially magnetized to generate a magnetic field that is substantially rotationally symmetric around an axis, said magnet being made of a single monolithic piece of material and comprising a plurality of grooves and/or elongate protrusions that are arranged in a rotationally symmetric pattern around said axis and that are shaped and sized so as to provide a substantially constant magnetic field gradient in a central region around said axis.

17. A sensor system comprising:
a magnetic field generator; and
a sensor device arranged at a distance from said magnetic field generator and adapted for measuring or determining at least one magnetic field component (Bx, By, Bz) and/or at least one magnetic field gradient component (dBx/dx, dBx/dy, dBy/dx, dBy/dy, dBz/dx, dBz/dy);
said magnetic field generator comprising a multi-pole magnet having a number of pole pairs that are axially magnetized to generate a magnetic field that is substantially rotationally symmetric around an axis, said multi-pole magnet comprising a plurality of grooves and/or elongate protrusions that are arranged in a rotationally symmetric pattern around said axis;
said plurality of grooves and/or elongate protrusions having a combination of width, height, and/or length selected such that a maximum signal error is minimized and to provide a substantially constant magnetic field gradient in a central region around said axis.

18. The sensor system of claim 17, wherein said plurality of grooves and/or elongate protrusions having the combination of width, height, and/or length selected such that a maximum signal error is minimized within a virtual cylinder having a radius of 1.4 mm and located at an axial distance in the range from 1.5 mm to 4.5 mm from the multi-pole magnet.

19. The sensor system of claim 17, wherein the maximum signal error is calculated using the formula:

$$\delta\theta_{max} = \max|\theta - \theta_m|,$$

wherein $$\theta_m = \arctan2\left(\frac{\frac{\delta B_x}{\delta y} + \frac{\delta B_y}{\delta x}}{\frac{\delta B_x}{\delta x} - \frac{\delta B_y}{\delta y}}\right)/2.$$

* * * * *